(12) United States Patent
Lee et al.

(10) Patent No.: US 8,431,933 B2
(45) Date of Patent: Apr. 30, 2013

(54) MEMORY LAYOUT STRUCTURE AND MEMORY STRUCTURE

(75) Inventors: Tzung-Han Lee, Taipei (TW); Chung-Lin Huang, Taoyuan County (TW); Hsien-Wen Liu, Taoyuan County (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 390 days.

(21) Appl. No.: 12/874,232

(22) Filed: Sep. 2, 2010

(65) Prior Publication Data

US 2012/0012907 A1    Jan. 19, 2012

(30) Foreign Application Priority Data

Jul. 16, 2010  (TW) ................ 99123514 A

(51) Int. Cl.
*H01L 29/10* (2006.01)
(52) U.S. Cl.
USPC ............... 257/67; 257/68; 257/71; 257/379; 257/E27.016
(58) Field of Classification Search ............... None
See application file for complete search history.

(56) References Cited

U.S. PATENT DOCUMENTS

| 5,140,389 | A | | 8/1992 | Kimura | |
|---|---|---|---|---|---|
| 5,305,252 | A | * | 4/1994 | Saeki | 365/63 |
| 5,714,779 | A | * | 2/1998 | Auer et al. | 257/306 |
| 2001/0025973 | A1 | * | 10/2001 | Yamada et al. | 257/296 |
| 2008/0197392 | A1 | | 8/2008 | Sakoh | |
| 2008/0266927 | A1 | * | 10/2008 | Lee et al. | 365/63 |

FOREIGN PATENT DOCUMENTS

TW    I240383    9/2005

* cited by examiner

*Primary Examiner* — Tan N Tran
*Assistant Examiner* — Scott R Wilson
(74) *Attorney, Agent, or Firm* — Winston Hsu; Scott Margo

(57) ABSTRACT

A memory layout structure is disclosed, in which, a lengthwise direction of each active area and each row of active areas form an included angle not equal to zero and not equal to 90 degrees, bit lines and word lines cross over each other above the active areas, the bit lines are each disposed above a row of active areas, bit line contact plugs or node contact plugs may be each disposed entirely on an source/drain region, or partially on the source/drain region and partially extend downward along a sidewall (edge wall) of the substrate of the active area to carry out a sidewall contact. Self-aligned node contact plugs are each disposed between two adjacent bit lines and between two adjacent word lines.

9 Claims, 8 Drawing Sheets

MEMORY LAYOUT STRUCTURE AND MEMORY STRUCTURE

BACKGROUND OF THE INVENTION

1. Field of the Invention

The present invention relates to a semiconductor memory device, and particularly to a semiconductor memory array layout structure and a memory structure.

2. Description of the Prior Art

Memory cell layouts are constantly miniaturized to be in accordance with product demands and the trends of high integration, high performance, and low power consumption. In a conventional dynamic random access memory (DRAM) layout, the word lines are perpendicular to the bit lines. Two word lines pass a same active area for forming two memory cells. A bit line contact plug is located between these two memory cells and electrically connected to a bit line. This bit line engages these two memory cells. Active areas in two adjacent rows are staggered from each other. Accordingly, an area for a repeating unit of 8 $F^2$ can be obtained. F means feature size.

Although there are various conventional memory layouts, there is still a need for a novel memory layout structure and memory structure for high integration.

SUMMARY OF THE INVENTION

One objective of the present invention is to provide a memory layout structure and a memory structure having a relatively small cell size.

In one aspect, the memory layout structure according to the present invention includes an active area array disposed in a substrate. The active area array includes a plurality of active areas which are arranged into a form of a plurality of columns of active areas and a plurality of rows of active areas. The active areas each have a lengthwise direction. The lengthwise direction and each of the rows of active areas form an included angle not equal to zero and not equal to 90 degrees. A plurality of recessed gate structures are disposed in the active areas at a middle portion respectively. A first diffusion region and a second diffusion region are disposed in each of the active areas at two sides of the middle portion, respectively. A plurality of word lines are disposed above the columns of active areas, respectively. Each word line is electrically connected to the recessed gate structures thereunder. A plurality of bit lines are disposed above the rows of active areas respectively. The bit lines and the word lines cross over each other. Each bit line is electrically connected to the first diffusion regions thereunder. A plurality of capacitor structures are disposed above the second diffusion regions respectively and electrically connected to the second diffusion regions through self-aligned node contact plugs respectively. Each of the self-aligned node contact plugs is disposed between two adjacent word lines and between two adjacent bit lines. Each of the self-aligned node contact plugs has only a portion to be located above only one portion of one of the second diffusion.

In another aspect, the memory layout structure according to the present invention includes a structure resembling the structure described above, but wherein, a plurality of word lines are disposed above the active area array, each of the word lines is perpendicular to the lengthwise direction of each of the active areas and electrically connected to the recessed gate structures thereunder. Theses recessed gate structures are located in different columns of the active areas, respectively. Furthermore, each of the self-aligned node contact plugs is disposed between two adjacent word lines and between two adjacent bit lines. In this embodiment, it may be not a limitation that each self-aligned node contact plug has only a portion to be located above only one portion of the second diffusion region.

In still another aspect, the memory structure according to the present invention includes an active area disposed in a substrate; an isolation structure disposed in the substrate to surround the active area; a recessed gate structure disposed in a recess of the substrate in the active area; a gate dielectric layer disposed on a bottom and a sidewall of the recess; a gate material layer disposed on the recessed gate structure; a first diffusion region and a second diffusion region disposed in the substrate in the active area at two sides of the recessed gate structure; a bit line contact plug disposed on the first diffusion region; a node contact plug disposed on the second diffusion region and extending downwardly along an edge wall of the substrate in the second diffusion region into the isolation structure; and a capacitor structure disposed on the node contact plug.

The area for a repeating unit in the memory layout structure according to the present invention may be small down to 6 $F^2$ or 4 $F^2$. Each active area has a length in a lengthwise direction and a width in a widthwise direction. The lengthwise direction of the active area and each of the rows of active areas together form an included angle not equal to zero and not equal to 90 degrees. The bit lines and the word lines cross over each other. The node contact plugs are each allowed to be disposed between two adjacent bit lines and between two adjacent word lines, such that the node contact plugs can be made using a self-alignment process. In other hand, a contact plug may be disposed to extend downwardly along an edge wall of the substrate in the source/drain regions for increasing contact area to maintain good performance of the memory.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
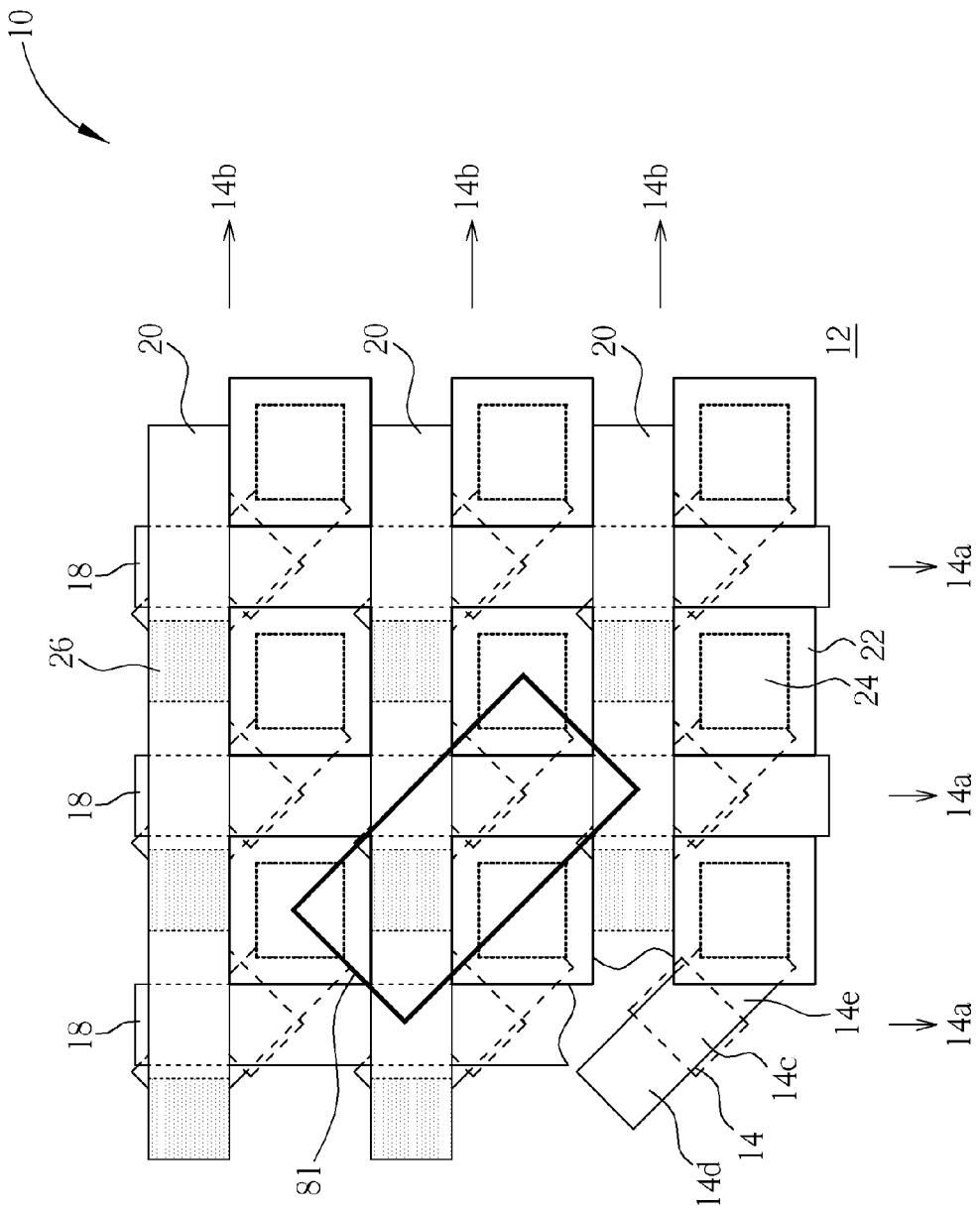
FIGS. 1 through 4 are diagrams illustrating some embodiments of the memory layout structures according to the present invention.

FIG. 1 is a schematic diagram illustrating a memory layout structure according to an embodiment of the present invention. A memory layout structure 10 includes an active area array disposed in a substrate 12. The active area array includes a plurality of active areas 14 which are arranged into a form of a plurality of columns of active areas 14a in a certain pitch and a plurality of rows of active areas 14b in another certain pitch. The active areas 14 each have a lengthwise direction. The lengthwise direction of the active areas 14 and each of the rows of active areas 14 (i.e. in the row direction) form an included angle not equal to zero and not equal to 90 degrees, either. A plurality of recessed gate structures are disposed in the active areas 14 at a middle portion 14c, respectively. A first diffusion region 14d and a second diffusion region 14e are disposed in an active area at two sides of the middle portion, respectively. A plurality of word lines 18 are disposed above the columns of active areas 14a, respectively. Each word line 18 is electrically connected to the gate structures in the columns of active areas 14a under this word line 18. A plurality of bit lines 20 are disposed above the rows of active areas 14b, respectively. The bit lines 20 and the word lines 18 cross over each other. Each bit line 20 is electrically connected to the first diffusion regions 14d in one row of active areas 14b under this bit line 20. The word line may be disposed under or above the bit line. There is a capacitor structure 22 disposed above each second diffusion region 14e. The capacitor structure 22 is electrically connected to the second diffusion region 14e through a self-aligned node contact plug 24. The self-aligned node contact plug 24 is disposed between two adjacent word lines 18 and between two adjacent bit lines 20 and can be made through a self-alignment process. The self-aligned node contact plug 24 has only one portion to be located above only one portion of the second diffusion region 14e. As shown, the self-aligned node contact plug 24 has a cross-sectional profile in a square shape; however, the self-aligned node contact plug 24 contacts the top surface of the second diffusion region 14e with an area of a substantial triangle shape, and other portion of the self-aligned node contact plug 24 may further extend downwardly along and contact an edge wall of the substrate 12.

Referring to FIG. 1, in the memory layout unit 81, the active area 14 may have a length of 0.75 F×3 and a width of 0.75 F. The distances from the active area 14 to an adjacent one at the long side and to another adjacent one at the short side are both 0.75 F. Thus, an area of 6 $F^2$ is obtained.

As shown in FIG. 1, in the memory layout structure 10, each bit line 20 is electrically connected to the first diffusion region 14d through a bit line contact plug 26. Accordingly, a bit line contact plug is utilized for controlling only one memory cell in a cell unit. It should be noted that the bit line contact plug 26 has only one portion to be located above only one portion of the first diffusion region 14d. As shown in FIG. 1, the contact plug 26 has a cross-sectional profile in a square shape; however, the contact plug 26 contacts the top surface of the first diffusion region 14d with an area of a substantial triangle shape.

Figure 2:
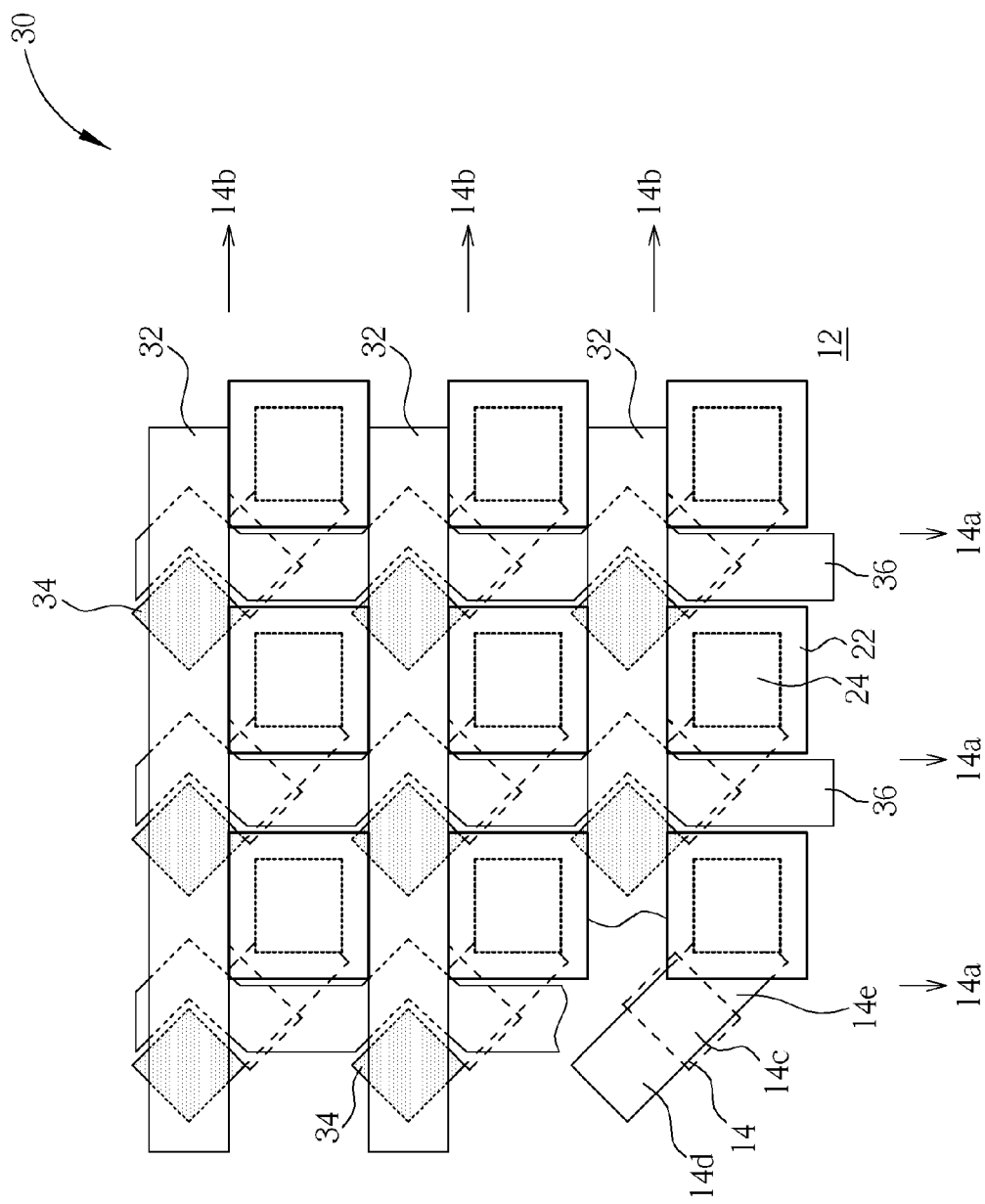

The word line may be in a shape of straight line or shifting wiggle line. In another embodiment, as shown in FIG. 2, a memory layout structure 30 includes a plurality of bit lines 32 which are each electrically connected to first diffusion regions 14d in one row of the active areas through bit line contact plugs 34. This bit line contact plugs 34 each contact the entire first diffusion region 14d. Each bit line 36 winds at locations of the bit line contact plugs 34 for avoiding the bit line contact plugs 34.

Figure 3:
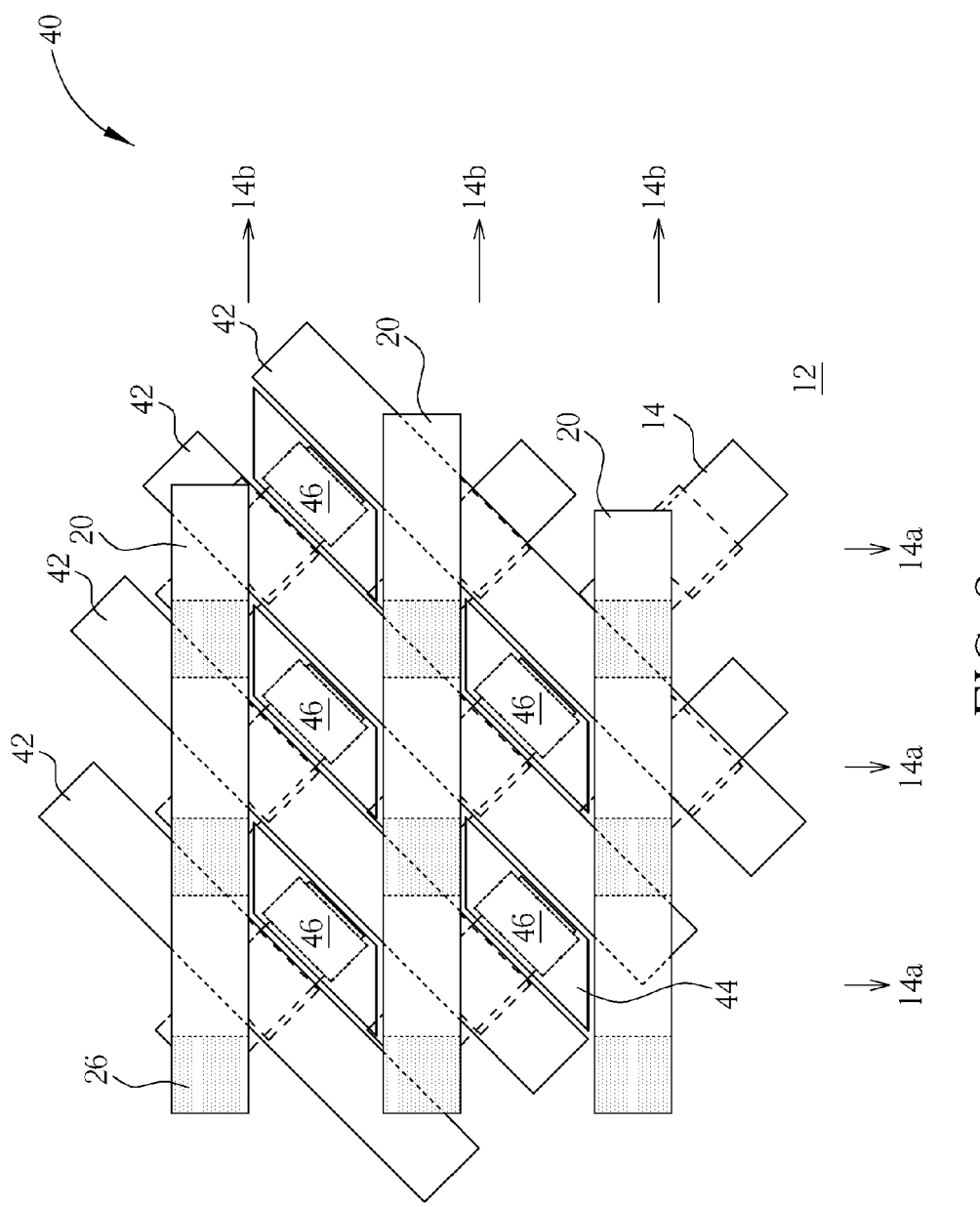

FIG. 3 is a schematic diagram illustrating a memory layout structure according to another embodiment of the present invention. A memory layout structure 40 resembles the memory layout structure 10 as shown in FIG. 1. However, the word lines 42 are each disposed above the active area array. A single word line 42 is disposed over a plurality of columns of active areas 14a and also a plurality of rows of the active areas 14b. In detail, each word line 42 has a line direction perpendicular to the lengthwise direction of the active area 14. Each word line 42 is electrically connected to the recessed gate structures under this word line 42. The active areas 14 which these recessed gate structures belong to respectively are located in different columns of the active areas 14a, respectively. The word lines 42 and the bit lines 20 cross over each other. There is a capacitor structure 44 disposed above each second diffusion region 14e. The capacitor structure 44 is electrically connected to the second diffusion region 14e through a self-aligned node contact plug 46. The self-aligned node contact plug 46 is disposed between two adjacent word lines 42 and between two adjacent bit lines 20.

Figure 4:
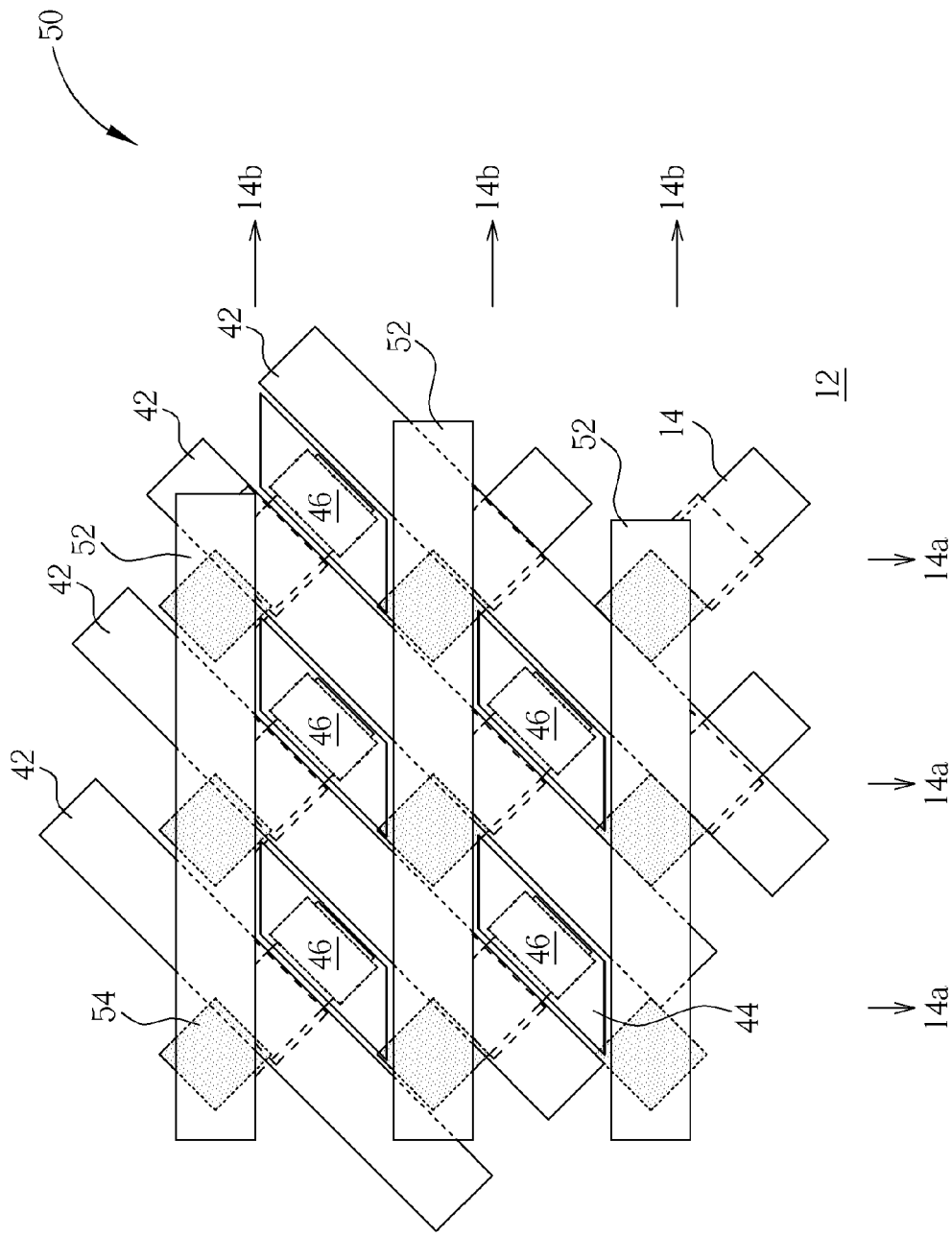

In another aspect, referring to FIG. 4, the memory layout structure 50 includes bit lines 52 electrically connected to the first diffusion regions 14d through bit line contact plugs 54. Each bit line contact plug 54 contacts an entire first diffusion region 14d.

Figure 5:
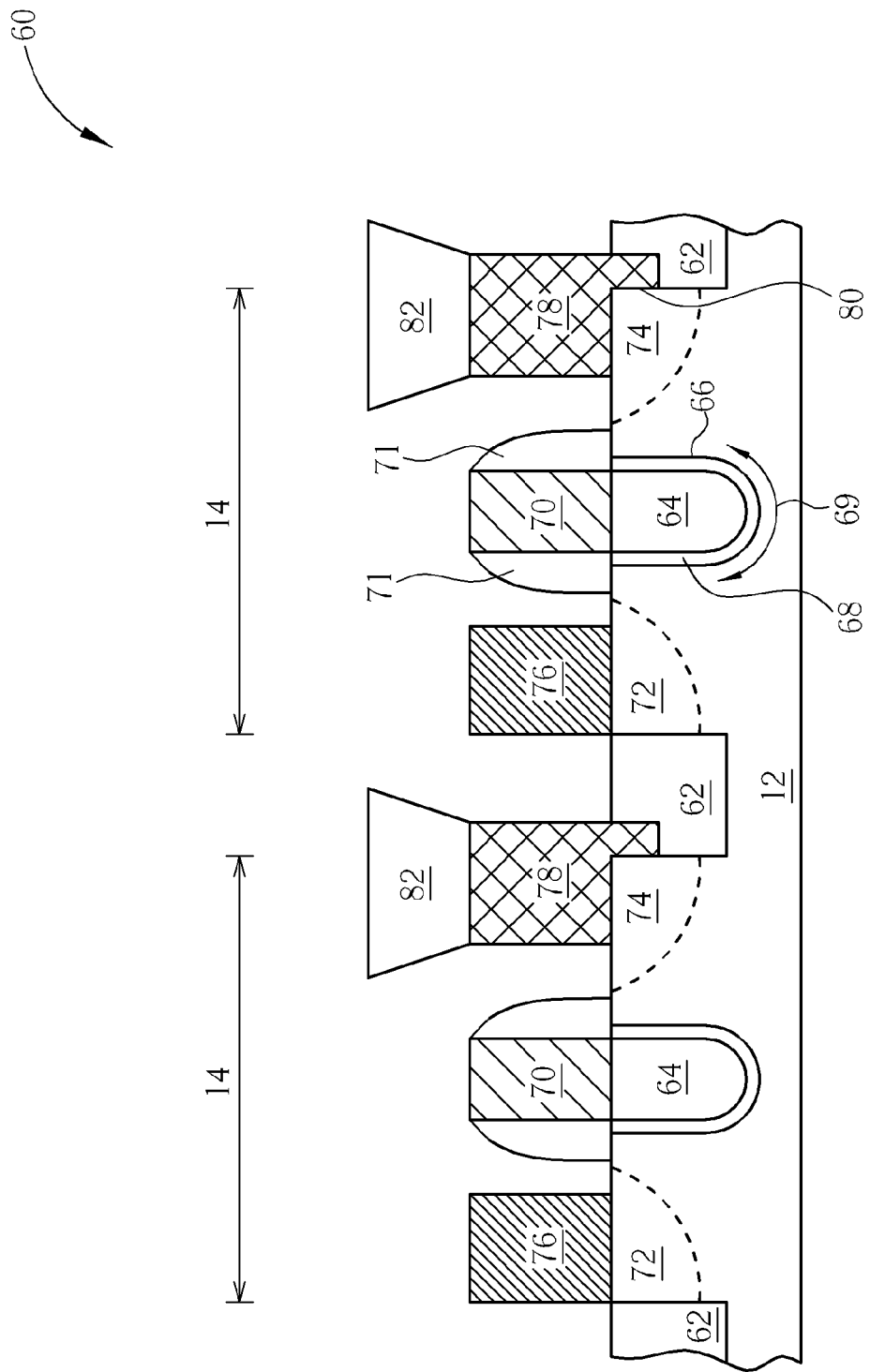
FIGS. 5 and 6 are cross-sectional views illustrating some embodiments of the memory structures according to the present invention.

FIG. 5 is a cross-sectional view illustrating a memory structure according to an embodiment of the present invention. The memory structure 60 includes an active area 14 in a substrate 12. An isolation structure 62 is disposed in the substrate 12 to surround the active area 14. A recessed gate structure 64 is disposed in a recess 66 of the substrate 12 in the active area 14. A gate dielectric layer 68 is disposed on a bottom and a sidewall of the recess 66. Accordingly, a recessed channel 69 is formed on the surface of the substrate 12 within the recess 66. A gate material layer 70 is disposed on the recessed gate structure 64. A spacer 71 is formed on the two sidewalls of the gate material layer 70. A first diffusion region 72 and a second diffusion region 74 are disposed in the substrate 12 in the active area 14 at two sides of the recessed gate structure 64. A bit line contact plug 76 is disposed on the first diffusion region 72. A node contact plug 78 is disposed on the second diffusion region 74 and extends downwardly along an edge wall 80 of the substrate 12 in the second diffusion region 74 into the isolation structure 62. A capacitor structure 82 is disposed on the node contact plug 78. As shown in FIG. 5, the bit line contact plug 76 is entirely located on the first diffusion region 72.

Figure 6:
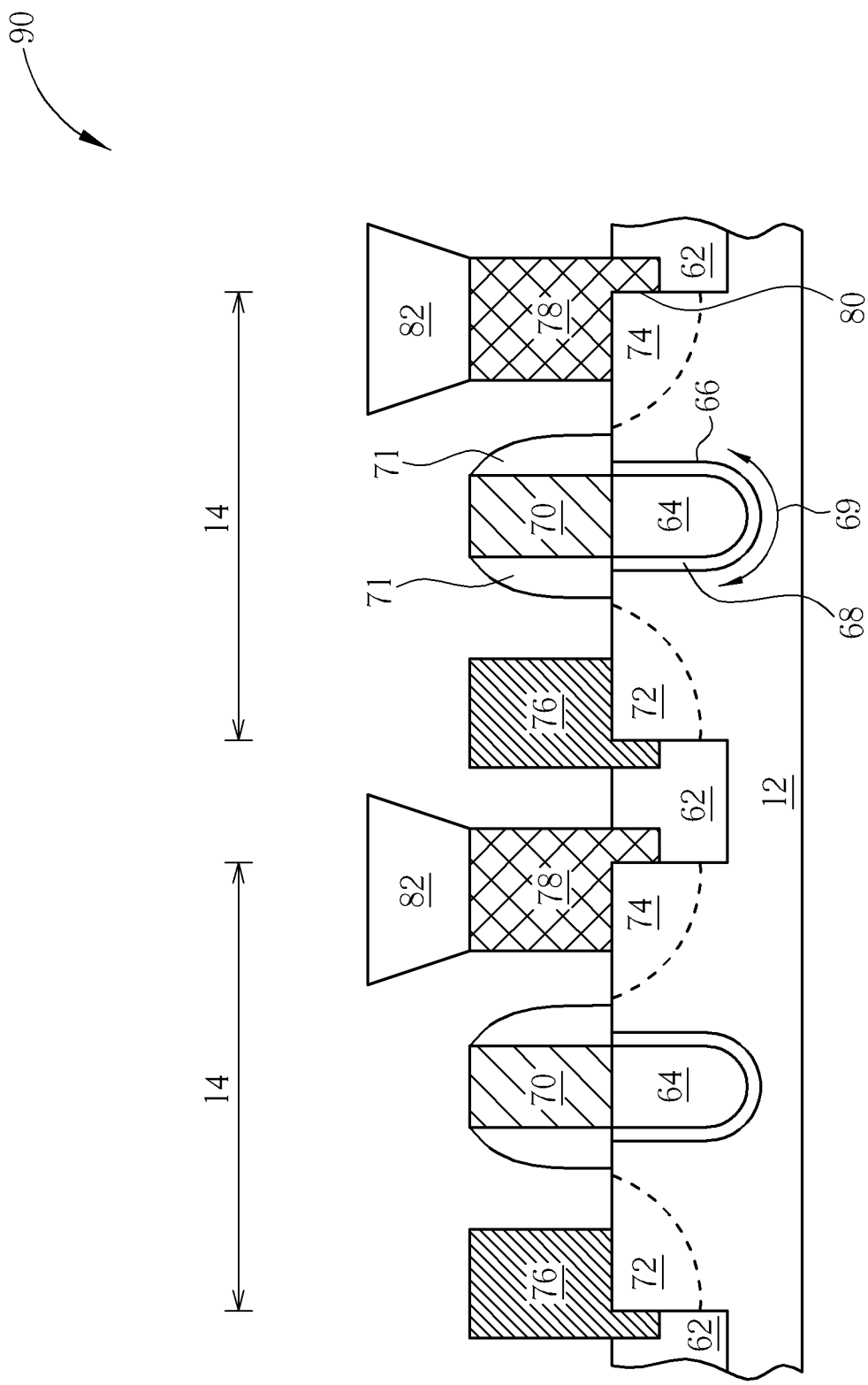

In another embodiment, referring to FIG. 6, in the memory structure 90, the bit line contact plug 76 has a portion which is disposed above the first diffusion region 72 and a portion which extends downwardly along an edge wall of the substrate 12 in the first diffusion region 72 into the isolation structure 62.

The transistor in the present invention has a structure of trench-type channel, and accordingly the diffusion regions may be within the substrate rather deeply. The downwardly-extending node contact plug or bit line contact plug may be allowed to contact the sidewall by taking advantage of the sidewall of the isolation structure (for example the shallow trench isolation structure), i.e. the sidewall (or referred to as edge wall) of the substrate in the diffusion region. Therefore, the contact area is still sufficient for obtaining a good contact. The depth for the extension is as desired. The depth of the isolation structure may be increased in accordance with the depth of the extension. The deeper the extension is, the larger the contact area between the contact plug (the node contact plug or the bit line contact plug) and the diffusion region is.

Figure 7:
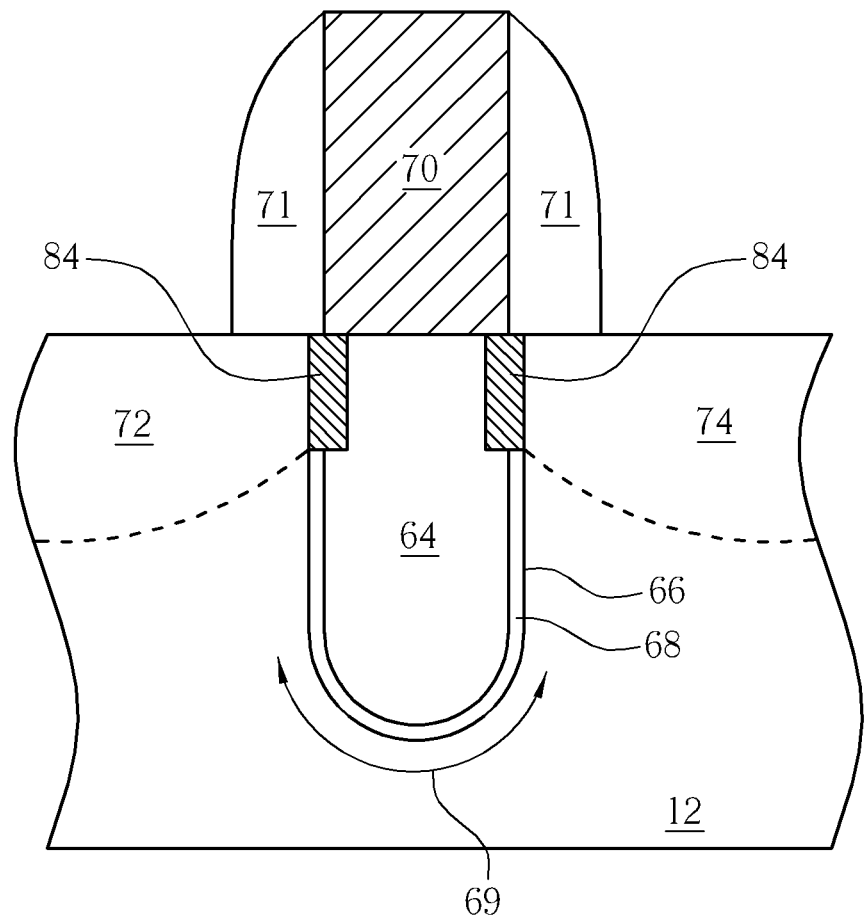
FIG. 7 is a cross-sectional view illustrating an embodiment of the recessed gate structure in the memory structure according to the present invention.
Figure 8:
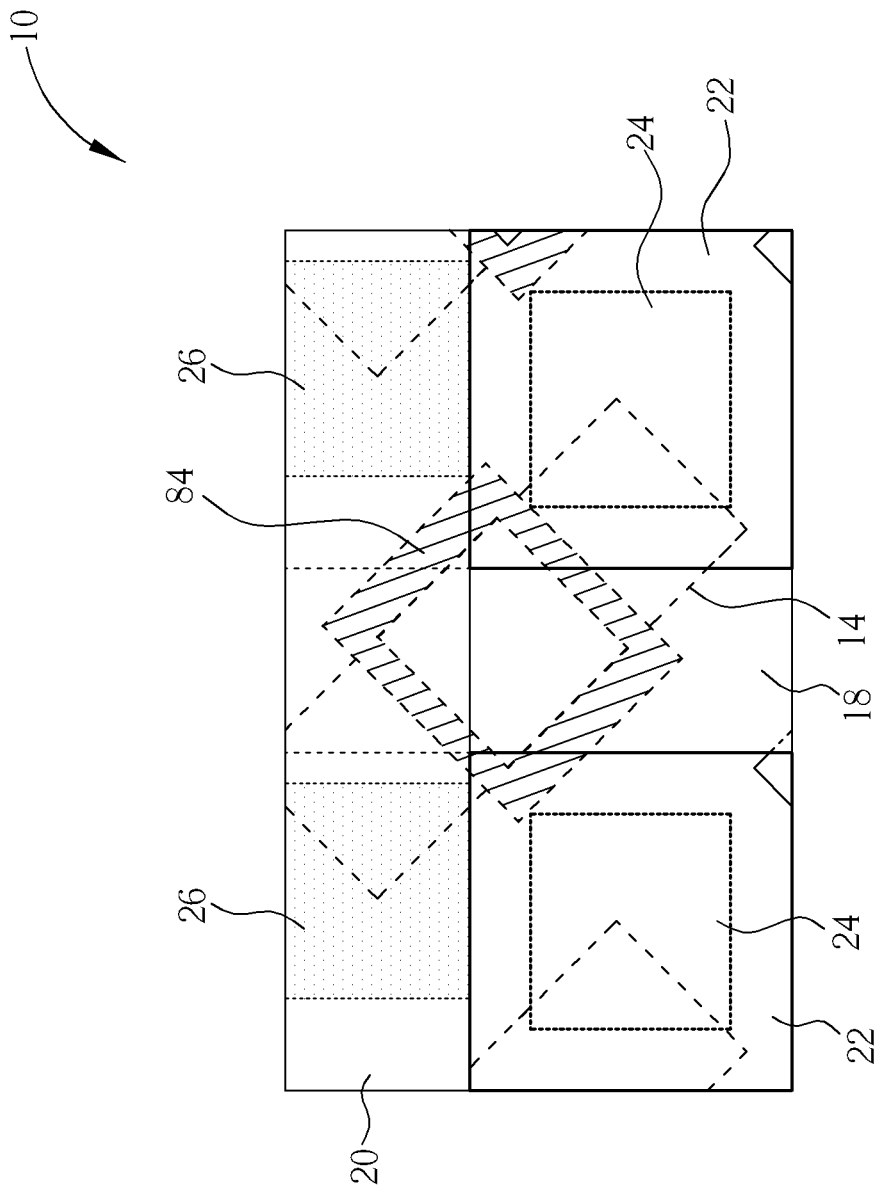
FIG. 8 is a diagram locally showing an embodiment of the memory layout structure according to the present invention.

As shown in FIG. 7, a relatively thick collar dielectric layer 84 may be further disposed at a neck portion of the recessed gate structure. That is, the collar dielectric layer 84 is between the upper sidewall of the recessed gate structure 64 and the substrate 12. The collar dielectric layer 84 may include for example oxide. Accordingly, as shown by FIG. 8, in the memory layout structure 10 according to the present invention, the collar dielectric layer 84 may well isolate each electric member, for example, isolating the recessed gate structure from the bit line contact plug 26, or isolating the recessed gate structure from the self-aligned node contact plug 26.

Those skilled in the art will readily observe that numerous modifications and alterations of the device and method may be made while retaining the teachings of the invention.

What is claimed is:

1. A memory layout structure, comprising:
an active area array disposed in a substrate, wherein the active area array comprises a plurality of active areas arranged into a plurality of columns of active areas and a plurality of rows of active areas, and the active areas each have a lengthwise direction, the lengthwise direction and each of the rows of active areas form an included angle not equal to zero and not equal to 90 degrees;
a plurality of recessed gate structures disposed in the active areas at a middle portion respectively, and a first diffusion region and a second diffusion region disposed in each of the active areas at two sides of the middle portion respectively, wherein each of the active areas contains only one of the recessed gate structures;
a plurality of word lines disposed above the columns of active areas respectively, wherein the word lines are each electrically connected to the recessed gate structures thereunder;
a plurality of bit lines disposed above the rows of active areas respectively, wherein, the bit lines and the word lines cross over each other, and the bit lines are each electrically connected to the first diffusion regions thereunder; and
a plurality of capacitor structures disposed above the second diffusion regions respectively and electrically connected to the second diffusion regions through self-aligned node contact plugs respectively, wherein the self-aligned node contact plugs are each disposed between two adjacent ones of the word lines and between two adjacent ones of the bit lines, and the self-aligned node contact plugs each have only a portion disposed above only a portion of the corresponding second diffusion region.

2. The memory layout structure according to claim 1, wherein, the bit lines are each electrically connected to the first diffusion regions thereunder through bit line contact plugs respectively, and each of the bit line contact plugs has only one portion to be located above only one portion of one of the first diffusion regions.

3. The memory layout structure according to claim 1, wherein, the bit lines are each electrically connected to the first diffusion regions thereunder through bit line contact plugs respectively, each of the bit line contact plugs is entirely located on each of the first diffusion regions, and each of the word lines winds at locations of the bit line contact plugs for avoiding the bit line contact plugs.

4. A memory layout structure, comprising:
an active area array disposed in a substrate, wherein the active area array comprises a plurality of active areas arranged into a plurality of columns of active areas and a plurality of rows of active areas, and the active areas each have a lengthwise direction, the lengthwise direction and each of the rows of active areas form an included angle not equal to zero and not equal to 90 degrees;
a plurality of recessed gate structures disposed in the active areas at a middle portion respectively, and a first diffusion region and a second diffusion region disposed in each of the active areas at two sides of the middle portion respectively;
a plurality of word lines disposed above the active area array, wherein each of the word lines is perpendicular to the lengthwise direction of each of the active areas and electrically connected to the recessed gate structures thereunder, which are located in different ones of the columns of the active areas, respectively;
a plurality of bit lines disposed above the rows of active areas respectively, wherein the bit lines and the word lines cross over each other, and each of the bit lines is electrically connected to the first diffusion regions thereunder, wherein each of the bit lines is electrically connected to the first diffusion regions thereunder through bit line contact plugs respectively, and each of the bit line contact plugs is disposed entirely on each of the first diffusion regions; and
a plurality of capacitor structures disposed above the second diffusion regions respectively and electrically connected to the second diffusion regions through self-aligned node contact plugs respectively, wherein each of the self-aligned node contact plugs is disposed between two adjacent ones of the word lines and between two adjacent ones of the bit lines.

5. The memory layout structure according to claim 4, wherein each of the bit lines is electrically connected to the first diffusion regions thereunder through bit line contact plugs respectively, and each of the bit line contact plugs has only one portion located above only one portion of one of the first diffusion regions.

6. A memory structure, comprising:
a substrate having an active area;
an isolation structure disposed in the substrate to surround the active area;
a recessed gate structure disposed in a recess of the substrate in the active area;
a gate dielectric layer disposed on a bottom and a sidewall of the recess;
a gate material layer disposed on the recessed gate structure;
a first diffusion region and a second diffusion region disposed in the substrate in the active area at two sides of the recessed gate structure;
a bit line contact plug disposed on the first diffusion region;
a node contact plug disposed on the second diffusion region and extending downwardly along an edge wall of the substrate in the second diffusion region into the isolation structure; and
a capacitor structure disposed on the node contact plug.

7. The memory structure according to claim 6, wherein the bit line contact plug is disposed entirely on the first diffusion region.

8. The memory structure according to claim 6, wherein the bit line contact plug is disposed partly on the first diffusion region and partly to extend downwardly along an edge wall of the substrate in the first diffusion region into the isolation structure.

9. The memory structure according to claim 6, wherein the recessed gate structure further comprises a collar dielectric layer disposed between an upper portion of the recessed gate structure and the substrate.

* * * * *